(12) United States Patent
Sugimoto et al.

(10) Patent No.: US 6,458,734 B1
(45) Date of Patent: Oct. 1, 2002

(54) DIELECTRIC CERAMIC COMPOSITION

(75) Inventors: Yasutaka Sugimoto, Kyoto; Osamu Chikagawa, Moriyama; Naoya Mori, Omihachiman, all of (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/910,352

(22) Filed: Jul. 20, 2001

(30) Foreign Application Priority Data

Jul. 21, 2000 (JP) ........................................ 2000-220866
Jun. 1, 2001 (JP) ........................................ 2001-166653

(51) Int. Cl.[7] ........................ C04B 35/468; H01G 4/12; B32B 18/00
(52) U.S. Cl. .................. 501/139; 501/138; 361/321.4; 361/321.5; 428/427; 428/432
(58) Field of Search .................. 501/32, 138, 139; 361/321.4, 321.5; 428/427, 432

(56) References Cited

U.S. PATENT DOCUMENTS 6,107,228 A * 8/2000 Sugimoto et al. ............ 501/139
6,108,192 A * 8/2000 Sugimoto et al. ......... 361/321.1
6,184,165 B1 * 2/2001 Kawata ........................ 501/32

* cited by examiner

*Primary Examiner*—David Brunsman
(74) *Attorney, Agent, or Firm*—Dickstein, Shapiro, Morin & Oshinsky LLP

(57) ABSTRACT

A dielectric ceramic compact is provided which can be obtained by sintering at a low temperature of 1000° C. or less, can be obtained by co-sintering a dielectric ceramic composition with a metal having superior electrical conductivity, such as Ag, and has a high relative dielectric constant, a high Q and a small temperature coefficient of dielectric properties. The dielectric ceramic composition combines an $xBaO\text{-}yTiO_2\text{-}zReO_{3/2}$ ceramic composition and a glass composition; wherein $8 \leq x \leq 18$, $52.5 \leq y \leq 65$, $20 \leq z \leq 40$, in which x, y, and z represent mole percent, $x+y+z=100$ and Re indicates a rare earth element, and the glass composition comprises about 10 to 25 wt % of $SiO_2$, about 10 to 40 wt % of $B_2O_3$, about 25 to 55 wt % of MgO, 0 to about 20 wt % of ZnO, 0 to about 15 wt % of $Al_2O_3$, about 0.5 to 10 wt % of $Li_2O$ and 0 to about 10 wt % of RO in which R is at least one selected from the group consisting of Ba, Sr and Ca.

20 Claims, 4 Drawing Sheets

DIELECTRIC CERAMIC COMPOSITION

BACKGROUND OF THE INVENTION

1. Field of the Invention

The present invention relates to dielectric ceramic compositions which are suitably used in a high frequency band, such as a microwave or a milliwave band, and which are used for forming microwave resonators, filters and laminated capacitors, and relates to a dielectric ceramic compact and multilayer ceramic substrates, ceramic electronic devices, and laminated ceramic electronic devices formed of the dielectric ceramic compacts.

2. Description of the Related Art

In order to miniaturize electronic devices, such as a microwave resonator and a filter, a structure formed of a dielectric ceramic material having a high relative dielectric constant has been proposed in place of a cavity resonator. When the relative dielectric constant of a dielectric material is represented by e, by exploiting the effect where the wavelength of an electromagnetic wave in the dielectric material is shortened by a factor of $(1/\in)^{1/2}$ of the wavelength in free space, miniaturization of a microwave resonator and a filter has been attempted by using a dielectric ceramic material having a high relative dielectric constant.

However, the relative dielectric constant $\in$ of a dielectric ceramic having a temperature coefficient which can be practically used for a dielectric resonator has been up to 100 or less, and as a result, it has been difficult to meet the requirement of further miniaturization.

Accordingly, a method using an LC resonator which is a known microwave circuit has been proposed to perform further miniaturization under the limitations of the relative dielectric constant of the dielectric ceramic. That is, by applying a laminating method which is practically used for forming laminated capacitors and multilayer substrates to the formation of an LC circuit, microwave electronic devices can be even further miniaturized and the reliability thereof can be improved.

However, in order to obtain an LC resonator having a high Q in a microwave band, the electrical conductivity of internal electrodes embedded in a laminated capacitor or in a multilayer circuit substrate must be high. As an internal electrode which can be simultaneously fired together with a dielectric material or a multilayer circuit substrate, a metal having a high electrical conductivity, such as gold (Au), silver (Ag) or copper (Cu), must be used.

Accordingly, the dielectric ceramic compact must have a high relative dielectric constant, a high Q, and a small temperature coefficient thereof, and in addition to these, the dielectric ceramic compact must be a material which can be obtained by co-sintering together with an internal electrode composed of a metal having a low melting point. A material which can meet all of these requirements has not been obtained up to now.

For example, since a metal such as Ag, Au or Cu has a melting point of approximately 960 to 1,063° C., and a conventional dielectric ceramic composition has a high firing temperature of 1,350° C. or more, co-sintering cannot be performed with the metal having superior electrical conductivity.

SUMMARY OF THE INVENTION

Accordingly, an object of the present invention is to provide a dielectric ceramic composition which has a high relative dielectric constant, a high Q, and a small temperature coefficient after sintering and, in addition, which can be sintered at a relatively low temperature.

Another object of the present invention is to provide a dielectric ceramic compact obtained by sintering the dielectric ceramic composition, a multilayer ceramic substrate, a ceramic electronic device and a laminated ceramic electronic device, which are formed of the dielectric ceramic compact described above and which has superior high frequency properties.

To these ends, in accordance with one aspect of the present invention, a dielectric ceramic composition comprises a $BaO—TiO_2—ReO_{3/2}$-based ceramic composition represented by the formula $xBaO—yTiO_2—zReO_{3/2}$ and a glass composition; wherein, in the formula $xBaO$-$yTiO_2$—$zReO_{3/2}$, $8 \leq x \leq 18$, $52.5 \leq y \leq 65$ and $20 \leq z \leq 40$, x, y, and z being mole percent, $x+y+z=100$, and Re indicates a rare earth element, and the glass composition comprises about 10 to 25 wt % of $SiO_2$, about 10 to 40 wt % of $B_2O_3$, about 25 to 55 wt % of $MgO$, 0 to about 20 wt % of $ZnO$, 0 to about 15 wt % of $Al_2O_3$, about 0.5 to 10 wt % of $Li_2O$ and 0 to about 10 wt % of RO in which R is at least one selected from the group consisting of Ba, Sr and Ca.

In the dielectric ceramic composition described above, the glass component is preferably Pb-free glass. In addition, the $BaO—TiO_2—ReO_{3/2}$-based dielectric ceramic is preferably Bi-free dielectric ceramic.

In addition to the primary component composed of the $BaO—TiO_2—ReO_{3/2}$-based dielectric ceramic and the glass component, the dielectric ceramic compact described above may further comprise CuO as a subcomponent.

In addition to the primary components composed of the $BaO—TiO_2—ReO_{3/2}$-based dielectric ceramic and the glass component, the dielectric ceramic composition described above may further comprise $TiO_2$ as a subcomponent.

In the dielectric ceramic composition described above, the content of the glass composition is preferably in the range of from about 15 to 35 wt % with respect to about 65 to 85 wt % of the $BaO—TiO_2—ReO_3$-based ceramic composition.

In accordance with another aspect of the present invention, a dielectric ceramic composition comprises a $BaO—TiO_2—ReO_{3/2}$-based ceramic composition represented by the formula $xBaO—yTiO_2—ReO_{3/2}$, a glass composition, CuO, and $TiO_2$; wherein $8 \leq x \leq 18$, $52.5 \leq y \leq 65$, and $20 \leq z \leq 40$, x, y, and z being mole percent and $x+y+z=100$, and Re indicates a rare earth element, and the glass composition comprises about 10 to 25 wt % of $SiO_2$, about 10 to 40 wt % of $B_2O_3$, about 25 to 55 wt % of $MgO$, 0 to about 20 wt % of $ZnO$, 0 to about 15 wt % of $Al_2O_3$, about 0.5 to 10 wt % of $Li_2O$, and 0 to about 10 wt % of RO in which R is at least one selected from the group consisting of Ba, Sr and Ca, and the contents of the $BaO—TiO_2—ReO_{3/2}$-based ceramic composition, the glass composition, the $TiO_2$ and the CuO are about 65 to 85 wt %, about 15 to 35 wt %, about 0.1 to 10 wt %, and about 3 wt % or less, respectively.

In the dielectric ceramic composition described above, the glass component is preferably Pb-free glass. In addition, the $BaO—TiO_2—ReO_{3/2}$-based dielectric ceramic is preferably Bi-free dielectric ceramic.

Since the $BaO—TiO_2—ReO_{3/2}$-based ceramic composition represented by the specific formula $xBaO—yTiO_2$—$zReO_{3/2}$ and the specific glass composition described above are used as primary materials, as will be apparent in examples described later, sintering at a low temperature of not more than 1100° C., preferably 1000° C. or less, can be performed, and hence, co-sintering with a metal having superior conductivity, such as Ag, Au or Cu, can also be performed.

In addition, a dielectric ceramic compact, which obtained by sintering the dielectric ceramic composition, can be obtained having a small temperature coefficient and a high relative dielectric constant in a high frequency band, more specifically, in a microwave band and a milliwave band.

Furthermore, when the glass component composed of the glass composition is crystallized, or the $BaO$—$TiO_2$—$ReO_{3/2}$-based ceramic composition and the glass composition form a crystal phase by reaction with each other, a crystal phase having a high Q, such as $Mg_2B_2O_5$, $Mg_3B_2O_6$, $BaTi_4O_9$, $Ba_2Ti_9O_{20}$, $Mg_2TiO_4$, $Mg_2SiO_4$, $Zn_2TiO_4$, $Zn_2Ti_3O_8$ or $ZnAl_2O_4$ is precipitated, whereby a dielectric ceramic compact having a high Q can be obtained.

The rare earth element Re used for the $BaO$—$TiO_2$—$ReO_{3/2}$-based ceramic composition is not specifically limited, and for example, Sc, Y, La, Ce, Pr, Nd, Pm, Sm, Eu, Gd, Tb, Dy, Ho, Er, Tm, Yb and Lu may be optionally used alone or in combination.

The reasons the composition represented by $xBaO$—$yTiO_2$—$zReO_{3/2}$ are used for the dielectric ceramic compact of the present invention are described below.

FIG. 1 is a ternary composition diagram of the $BaO$—$TiO_2$—$ReO_{3/2}$-based ceramic composition. In this ternary composition diagram, the area surrounded by the solid line P corresponds to the composition represented by the $xBaO$—$yTiO_2$—$zReO_{3/2}$.

For a composition in area A shown in FIG. 1, that is, for a composition in the area in which x is 18 or more, it is difficult to form the $BaO$—$TiO_2$—$ReO_{3/2}$-based ceramic composition by sintering, and a porous ceramic can only be obtained even at a firing temperature of 1,400° C. In area B in which y is more than 65 and z is less than 20, the temperature properties are inferior. When a multilayer circuit substrate containing a capacitor therein is formed, the temperature coefficient of capacitance (TCC) is excessively negative. In area C in which x is less than 8, the relative dielectric constant of the obtained ceramic compact is excessively decreased and sintering properties thereof are also unstable. In addition, in area D in which z is more than 40 and y is less than 52.5, the temperature coefficient of capacitance is excessively positive and the relative dielectric constant is also decreased.

In the present invention, the specific $BaO$—$TiO_2$—$ReO_{3/2}$-based ceramic composition and the specific glass composition described above constitute the primary component as described above.

The glass composition comprises about 10 to 25 wt % of $SiO_2$, about 10 to 40 wt % of $B_2O_3$, about 25 to 55 wt % of MgO, 0 to about 20 wt % of ZnO, 0 to about 15 wt % of $Al_2O_3$, about 0.5 to 10 wt % of $Li_2O$ and 0 to about 10 wt % of RO in which R is at least one selected from the group consisting of Ba, Sr and Ca. In this connection, ZnO and $Al_2O_3$ are additive components which may be or may not be present.

The $B_2O_3$ serves to decrease the glass viscosity and to facilitate sintering of the ceramic composition and the glass composition. In addition, $B_2O_3$ forms a crystal having a high Q, such as $Mg_2B_2O_5$ or $Mg_3B_2O_6$. However, when the content of $B_2O_3$ is more than about 40 wt %, the humidity resistance is degraded and when the content is less than about 10 wt %, sintering cannot be performed below 1100° C.

The $SiO_2$ forms a crystal having a high Q, such as $Mg_2SiO_4$. However, when the content of $SiO_2$ is more than about 25 wt %, since a softening temperature of the glass is excessively increased, the sintering properties of the ceramic composition and the glass composition are degraded, and when the content is less than about 10 wt %, the humidity resistance is degraded.

MgO serves to facilitate the reaction between the $BaO$—$TiO_2$—$ReO_{3/2}$-based ceramic composition and the glass composition and serves to decrease the softening temperature of the glass composition. In addition, MgO forms a crystal having a high Q, such as $Mg_2B_2O_5$, $Mg_3B_2O_6$, $Mg_2TiO_4$ or $Mg_2SiO_4$. When the content of is less than about 25 wt %, the sintering properties are degraded, and hence, sintering cannot be performed below 1100° C. In addition, when the content of MgO is more than about 55 wt %, the humidity resistance is degraded to some extent, and in addition, it is difficult to perform vitrification.

$Li_2O$ serves to decrease a softening temperature of the glass. When the content of $Li_2O$ is more than about 10 wt %, the humidity resistance is degraded to some extent, and when the content is less than about 0.5 wt %, the softening temperature is excessively increased so that sintering cannot be performed.

ZnO serves to increase the Q; however, when the content thereof is more than about 20 wt %, the sintering properties are degraded. In addition, $Al_2O_3$ serves to improve the humidity resistance; however, when the content is more than about 10 wt %, the sintering properties are degraded. ZnO forms a crystal having a high Q, such as $Zn_2TiO_4$, $Zn_2Ti_3O_8$ or $ZnAl_2O_4$.

BaO, CaO and SrO serve to improve sintering properties; however, when the contents thereof are more than about 10 wt %, the Q is decreased. Particularly, BaO forms a crystal having a high Q, such as $BaTi_4O_9$ or $Ba_2Ti_9O_{20}$.

The dielectric ceramic composition of the present invention preferably further comprises CuO as a subcomponent in addition to the primary component described above. The CuO as the subcomponent serves as an auxiliary sintering agent. However, when the content of CuO is more than about 3 wt %, the Q is decreased, and hence, the temperature coefficient of capacitance may be excessively positive in some cases.

The dielectric ceramic composition of the present invention may further comprise $TiO_2$ as a subcomponent in addition to the primary component described above, and $TiO_2$ serves to facilitate crystallization of glass. However, when the content of $TiO_2$ is more than about 10 wt % of the dielectric ceramic compact, the sintering properties may be degraded in some cases.

In the dielectric ceramic compact of the present invention, when the content of the glass composition is less than about 15 wt % of the entire dielectric ceramic compact, it may be difficult to perform sintering in some cases and when the content is more than about 35 wt %, the humidity resistance may be degraded or the relative dielectric constant may be decreased in some cases. Accordingly, about 15 to 35 wt % of the glass composition is preferably contained with respect to about 65 to 85 wt % of the $BaO$—$TiO_2$—$ReO_{3/2}$-based ceramic composition.

Furthermore, the dielectric ceramic compact of the present invention preferably comprises about 65 to 85 wt % of the $BaO$—$TiO_2$—$ReO_{3/2}$-based ceramic composition, about 15 to 35 wt % of the glass composition, about 0.1 to 10 wt % of $TiO_2$ and about 3 wt % or less of CuO.

In accordance with another aspect of the present invention, a multilayer ceramic substrate is provided having a dielectric ceramic layer comprising the dielectric ceramic compact of the present invention and electrodes provided on the ceramic substrate. In this multilayer ceramic substrate, since the dielectric ceramic layer comprise the dielectric ceramic compact of the present invention, and the electrodes are formed on the dielectric ceramic layer, the multilayer ceramic substrate can be obtained by firing at a low temperature, such as 1100° C. or less, and as a result, a multilayer ceramic substrate having a high dielectric constant, a high Q and a small temperature coefficient of dielectric properties can be obtained.

The multilayer ceramic substrate described above may further comprise another dielectric ceramic layer having a dielectric constant lower than that of the dielectric ceramic layer of the invention.

The electrodes of the multilayer ceramic substrate described above may be disposed so as to oppose each other with at least a part of the dielectric ceramic layer provided therebetween for forming a capacitor.

In the multilayer ceramic substrate described above, the electrodes may comprise a plurality of internal electrodes for forming a capacitor and a plurality of coil conductors in electrical contact with each other for forming an inductor.

In accordance with another aspect of the present invention, a ceramic electronic device is provided which comprises the multilayer ceramic substrate described above and at least one electronic element which is mounted on the multilayer ceramic substrate and which forms a circuit together with the electrodes.

Preferably, the ceramic electronic device described above may further comprise a cap fixed on the multilayer ceramic substrate so as to surround the electronic element. More preferably, the ceramic electronic device comprises an electrical conductive cap as the cap.

In addition, the ceramic electronic device described above may further comprises a plurality of external electrodes formed only on the bottom surface of the multilayer ceramic substrate described above and a plurality of throughhole conductors in electrical contact with the external electrodes described above and in electrical contact with the electrodes or the electronic element described above.

In accordance with yet another aspect of the present invention, a laminated ceramic electronic device is provided comprising a sintered ceramic body comprising the dielectric ceramic compact of the present invention, a plurality of electrodes disposed in the sintered ceramic body and a plurality of external electrodes which are provided on outside surfaces of the sintered ceramic body and which are each in electrical contact with one of the plurality of electrodes. The plurality of electrodes may comprise internal electrodes laminated to each other with at least a part of the sintered ceramic body provided therebetween so as to from a laminated capacitor unit. Separately or in addition to the internal electrodes for forming the laminated capacitor unit, the plurality of electrodes may further comprise coil conductors in electrical contact with each other so as to form a laminated inductor unit.

DESCRIPTION OF THE PREFERRED EMBODIMENTS

Figure 1:
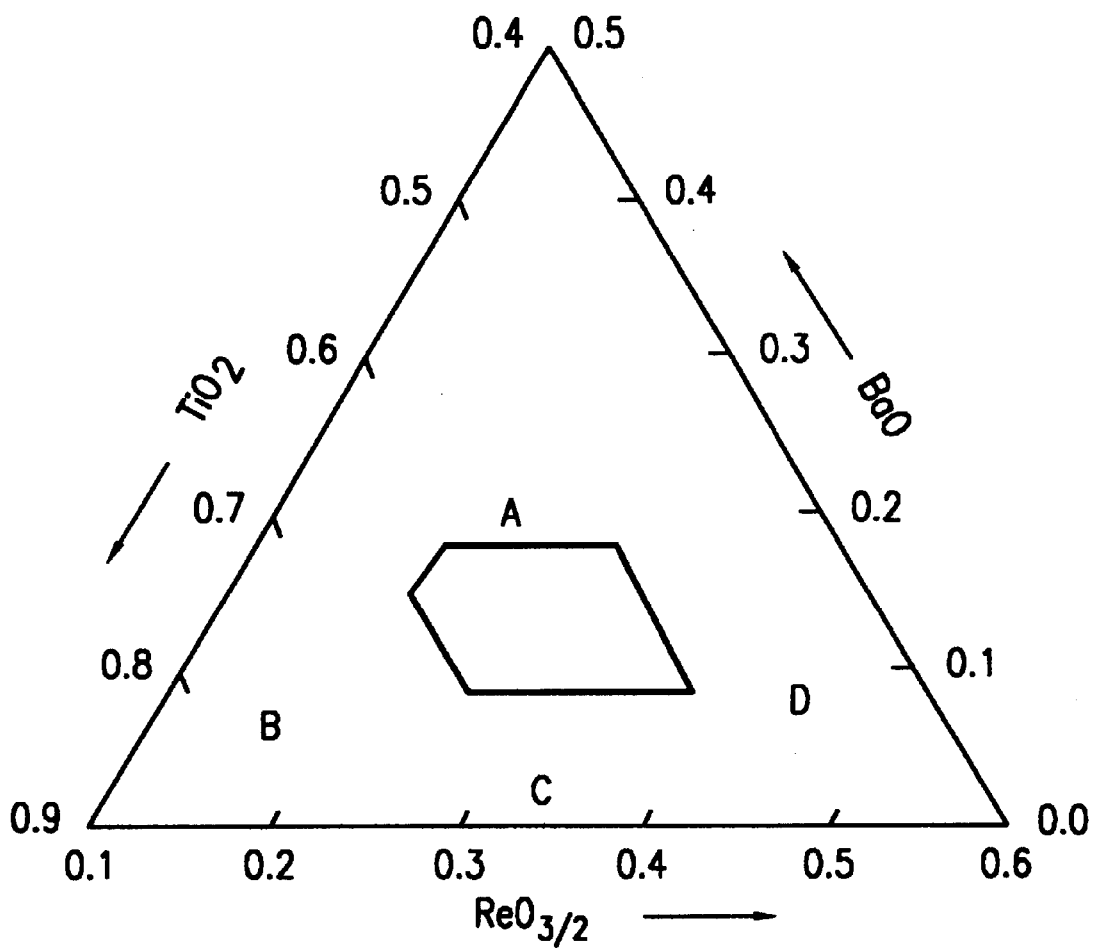
FIG. 1 is a ternary composition diagram of a BaO—$TiO_2$—$ReO_{3/2}$-based ceramic composition for forming a dielectric ceramic compact of the present invention.

Hereinafter, particular examples of a dielectric ceramic compact of the present invention will first be described, and subsequently, embodiments relating to the structures of a multilayer ceramic substrate, a ceramic electronic device and a laminated ceramic electronic device will be described, whereby the present invention will be fully understood.
Formation of Ceramic Composition First, $BaCO_3$, $TiO_2$, $Nd_2O_3$, $Pr_2O_3$ and $Sm_2O_3$ were weighed and mixed together so that the molar ratios of BaO, $TiO_2$ and $ReO_{3/2}$ were in accordance with those shown in the column of the primary component in Table 1 below. The mixed starting material thus formed was calcined at 1,150° C. for 1 hour. Next, the calcined product was pulverized, thereby yielding ceramic compositions S1 to S10 shown in Table 1. Ceramic compositions S1 to S10 were used for forming dielectric ceramic compositions shown below.

TABLE 1

| Ceramic Composition | Primary Component (Mole Percent) | | |
|---|---|---|---|
| No. | BaO | $TiO_2$ | $ReO_{3/2}$ |
| S1 | 13 | 58 | Nd:10, Sm:19 |
| S2 | 25 | 55 | Nd:20 |
| S3 | 5 | 75 | Nd:20 |
| S4 | 2 | 65 | Nd:33 |
| S5 | 10 | 50 | Nd:40 |
| S6 | 18 | 62 | Nd:20 |
| S7 | 8 | 65 | Nd:27 |
| S8 | 8 | 52.5 | Nd:39.5 |
| S9 | 13 | 58 | Sm:29 |
| S10 | 13 | 58 | Pr:6, Sm:23 |

Formation of Glass Composition

After $B_2O_3$, $SiO_2$, ZnO, MgO, $Li_2O$, $Al_2O_3$, BaO, CaO and SrO were weighed and mixed sufficiently so as to have the composition ratios shown in Table 2 below, the mixtures were melted at 1,100 to 1,400° C., were then injected into water for quenching and were wet-pulverized, thereby yielding glass compositions G1 to G24.

TABLE 2

| Glass No. | MgO (wt %) | ZnO (wt %) | $Al_2O_3$ (wt %) | $B_2O_3$ (wt %) | $SiO_2$ (wt %) | $Li_2O$ (wt %) | BaO (wt %) | SrO (wt %) | CaO (wt %) |
|---|---|---|---|---|---|---|---|---|---|
| G1 | 40 | 7 | 1.5 | 28.5 | 15.5 | 7.5 | | | |
| G2 | 15 | 25 | 1.5 | 40.0 | 20.0 | 7.5 | | | |
| G3 | 25 | 20 | 1.5 | 35.0 | 18.0 | 0.5 | | | |
| G4 | 57 | 5 | 1.5 | 10.0 | 18.0 | 8.5 | | | |
| G5 | 65 | 5 | 1.5 | 8.0 | 17.0 | 3.5 | | | |
| G6 | 42 | 0 | 1.5 | 30.5 | 18.5 | 7.5 | | | |
| G7 | 40 | 8.5 | 0 | 28.5 | 15.5 | 7.5 | | | |

TABLE 2-continued

| Glass No. | MgO (wt %) | ZnO (wt %) | Al$_2$O$_3$ (wt %) | B$_2$O$_3$ (wt %) | SiO$_2$ (wt %) | Li$_2$O (wt %) | BaO (wt %) | SrO (wt %) | CaO (wt %) |
|---|---|---|---|---|---|---|---|---|---|
| G8 | 38 | 7 | 15 | 22 | 10.5 | 7.5 | | | |
| G9 | 37 | 7 | 20 | 18 | 13.5 | 5.5 | | | |
| G10 | 28 | 7 | 1.5 | 50 | 5 | 8.5 | | | |
| G11 | 42 | 7 | 1.5 | 30 | 10 | 9.5 | | | |
| G12 | 30 | 7 | 1.5 | 20 | 35 | 6.5 | | | |
| G13 | 42 | 9 | 1.5 | 30.5 | 17 | 0 | | | |
| G14 | 43 | 5 | 1.5 | 26.5 | 14 | 10 | | | |
| G15 | 37 | 5 | 1.5 | 24.5 | 13 | 20 | | | |
| G16 | 39 | 7 | 1.5 | 28.5 | 15.5 | 7.5 | 1 | | |
| G17 | 30 | 7 | 1.5 | 28.5 | 15.5 | 7.5 | 10 | | |
| G18 | 25 | 7 | 1.5 | 28.5 | 15.5 | 7.5 | 15 | | |
| G19 | 39 | 7 | 1.5 | 28.5 | 15.5 | 7.5 | | 1 | |
| G20 | 30 | 7 | 1.5 | 28.5 | 15.5 | 7.5 | | 10 | |
| G21 | 25 | 7 | 1.5 | 28.5 | 15.5 | 7.5 | | 15 | |
| G22 | 39 | 7 | 1.5 | 28.5 | 15.5 | 7.5 | | | 1 |
| G23 | 30 | 7 | 1.5 | 28.5 | 15.5 | 7.5 | | | 10 |
| G24 | 25 | 7 | 1.5 | 28.5 | 15.5 | 7.5 | | | 15 |

Formation of Dielectric Ceramic Compact

Ceramic compositions S1 to S10 and glass compositions G1 to G24 thus formed were mixed so that the mixtures, which corresponding to the dielectric ceramic composition, have the composition ratios shown in Table 3 or 4, and powdered CuO and powdered TiO$_2$ were added to the mixtures as subcomponents in accordance with the ratios shown in Table 3 or 4 and were then mixed sufficiently. Subsequently, appropriate amounts of a binder, a plasticizer and a solvent were added to the individual mixtures thus obtained and were then kneaded, thereby yielding slurries.

Each slurry thus obtained was processed by the doctor blade method so as to form ceramic green sheets 50 μm thick. The ceramic green sheets were cut into a rectangular shape 30 mm long and 10 mm wide. The plurality of rectangular ceramic green sheets thus formed was laminated to each other and bonded together by applying a pressure, thereby yielding a laminate 0.5 mm thick. Subsequently, the laminate was fired at 800 to 1,100° C. for 1 hour, whereby dielectric ceramic compacts in the form of a plate of sample No. 1 to 43 shown in Tables 3 and 4 were obtained.

For the dielectric ceramic compacts obtained described above, measurements of the relative dielectric constant (∈), the Q and the temperature coefficient of capacitance (TCC, ppm/° C.) were performed. In this measurement, the relative dielectric constant (∈) and the Q were measured at a resonant frequency (1 MHZ) by a short-circuit dielectric resonant method. The results are shown in Tables 3 and 4.

TABLE 3

| Sample No. | Ceramic Composition No. | Ceramic Composition Content (Wt %) | Glass Composition No. | Glass Composition Content (Wt %) | CuO Content (Wt %) | TiO$_2$ Content (Wt %) | Sintering Temperature (° C.) | Relative Dielectric Constant (∈) | Qf/GHz | Temperature Coefficient of Capacitance (TCC) (ppm/° C.) | Remarks |
|---|---|---|---|---|---|---|---|---|---|---|---|
| 1 | S1 | 73 | G1 | 22 | 1 | 4 | 900 | 31 | 12000 | +8 | |
| 2 | S2 | 73 | G1 | 22 | 1 | 4 | 900 | 37 | 3000 | −100 | Large negative TCC |
| 3 | S3 | 73 | G1 | 22 | 1 | 4 | 900 | 21 | 4000 | −160 | Low ∈ |
| 4 | S4 | 73 | G1 | 22 | 1 | 4 | 900 | 16 | 3000 | +20 | Low ∈ |
| 5 | S5 | 73 | G1 | 22 | 1 | 4 | 900 | 14 | 4000 | +90 | Low ∈ |
| 6 | S6 | 73 | G1 | 22 | 1 | 4 | 900 | 33 | 8500 | −60 | |
| 7 | S7 | 73 | G1 | 22 | 1 | 4 | 900 | 33 | 6000 | −60 | |
| 8 | S8 | 73 | G1 | 22 | 1 | 4 | 900 | 25 | 5500 | +10 | |
| 9 | S9 | 73 | G1 | 22 | 1 | 4 | 900 | 30 | 12000 | +18 | |
| 10 | S10 | 73 | G1 | 22 | 1 | 4 | 900 | 31 | 11000 | +4 | |
| 11 | S1 | 73 | G2 | 22 | 1 | 4 | 850 | 30 | 2500 | +12 | Inferior Humidity Resistance |
| 12 | S1 | 73 | G3 | 22 | 1 | 4 | 900 | 29 | 5000 | +20 | |
| 13 | S1 | 73 | G4 | 22 | 1 | 4 | 900 | 31 | 6500 | +15 | |
| 14 | S1 | 73 | G5 | 22 | 1 | 4 | — | — | — | — | No vitrification |
| 15 | S1 | 73 | G6 | 22 | 1 | 4 | 900 | 30 | 9000 | +10 | |
| 16 | S1 | 73 | G7 | 22 | 1 | 4 | 900 | 31 | 9500 | +5 | |
| 17 | S1 | 73 | G8 | 22 | 1 | 4 | 900 | 28 | 7500 | +20 | |

TABLE 4

| Sample No. | Ceramic Composition No. | Content (Wt %) | Glass Composition No. | Content (Wt %) | CuO Content (Wt %) | TiO$_2$ Content (Wt %) | Sintering Temperature (° C.) | Relative Dielectric Constant ($\epsilon$) | Qf/GHz | Temperature Coefficient of Capacitance (TCC) (ppm/° C.) | Remarks |
|---|---|---|---|---|---|---|---|---|---|---|---|
| 18 | S1 | 73 | G9  | 22 | 1 | 4  | 1050 | 28 | 5500  | +20 | Slightly High Sintering Temp. |
| 19 | S1 | 73 | G10 | 22 | 1 | 4  | 850  | 32 | 2000  | +25 | Low Q |
| 20 | S1 | 73 | G11 | 22 | 1 | 4  | 900  | 30 | 6000  | +15 |  |
| 21 | S1 | 73 | G12 | 22 | 1 | 4  | 1100 | 28 | 4000  | +20 | High Sintering Temp. |
| 22 | S1 | 73 | G13 | 22 | 1 | 4  | 1050 | 29 | 6000  | +25 | Slightly High Sintering Temp. |
| 23 | S1 | 73 | G14 | 22 | 1 | 4  | 850  | 30 | 5000  | +30 |  |
| 24 | S1 | 73 | G15 | 22 | 1 | 4  | 800  | 29 | 3000  | +25 | Inferior Humidity Resistance |
| 25 | S1 | 55 | G1  | 40 | 1 | 4  | 850  | 18 | 4000  | +70 | Slightly low $\epsilon$ |
| 26 | S1 | 65 | G1  | 30 | 1 | 4  | 880  | 24 | 6000  | +40 |  |
| 27 | S1 | 85 | G1  | 15 | 0 | 0  | 1000 | 38 | 5500  | −10 |  |
| 28 | S1 | 90 | G1  | 8  | 1 | 1  | 1100 | 43 | 6000  | −20 | High Sintering Temp. |
| 29 | S1 | 60 | G1  | 35 | 1 | 4  | 850  | 21 | 4500  | −30 |  |
| 30 | S1 | 71 | G1  | 22 | 3 | 4  | 850  | 33 | 5000  | +40 |  |
| 31 | S1 | 70 | G1  | 22 | 5 | 3  | 800  | 35 | 2000  | +50 | Low Q |
| 32 | S1 | 76.9 | G1 | 22 | 1 | 0.1 | 900 | 32 | 9000  | 0 |  |
| 33 | S1 | 67 | G1  | 22 | 1 | 10 | 1000 | 35 | 11000 | −10 |  |
| 34 | S1 | 62 | G1  | 22 | 1 | 15 | 1100 | 37 | 9000  | −30 | High Sintering Temp. |
| 35 | S1 | 73 | G16 | 22 | 1 | 4  | 900  | 32 | 6000  | +10 |  |
| 36 | S1 | 73 | G17 | 22 | 1 | 4  | 900  | 33 | 3000  | +14 |  |
| 37 | S1 | 73 | G18 | 22 | 1 | 4  | 900  | 34 | 1500  | +18 | Low Q |
| 38 | S1 | 73 | G19 | 22 | 1 | 4  | 900  | 32 | 8000  | +10 |  |
| 39 | S1 | 73 | G20 | 22 | 1 | 4  | 900  | 33 | 3500  | +12 |  |
| 40 | S1 | 73 | G21 | 22 | 1 | 4  | 900  | 34 | 1800  | +15 | Low Q |
| 41 | S1 | 73 | G22 | 22 | 1 | 4  | 900  | 31 | 11000 | +10 |  |
| 42 | S1 | 73 | G23 | 22 | 1 | 4  | 900  | 32 | 4000  |  |  |
| 43 | S1 | 73 | G24 | 22 | 1 | 4  | 900  | 33 | 2000  | +13 | Low Q |

As can be seen from Table 3, the temperature coefficient had a large negative value, such as −100 ppm/° C., in the dielectric ceramic compact of sample No. 2 using S2 containing 25 mole percent of BaO.

In the case in which ceramic composition S3 containing 5 mole percent of BaO and 75 mole percent of TiO$_2$ was used, as can be seen from the result of sample No. 3, the relative dielectric constant $\in$ was low, such as 21.

Similar to the above, in the cases of sample No. 4 which used ceramic composition S4 containing 2 mole percent of BaO and of sample No. 5 which used ceramic composition S5 containing 50 mole percent of TiO$_2$, the relative dielectric constants $\in$ were low, such as 16 and 14, respectively.

In sample No. 11 which used glass composition G2 containing 15 wt % of MgO, 20 wt % of ZnO and 40 wt % of B$_2$O$_3$, the humidity resistance was not satisfactory. A dielectric ceramic compact held under the conditions of 85° C. and 85% RH for 1100 hours was classified defective in humidity resistance if it had an electrical resistivity of less than $10^{10} \Omega \cdot$cm.

Sample No. 14 using glass composition G5 containing 65 wt % of MgO and 10 wt % of B$_2$O$_3$ could not be vitrified.

Sample No. 18 using glass composition G9 containing 20 wt % of Al$_2$O$_3$ had a slightly high sintering temperature of 1,050° C.

Sample No. 21 using glass composition G12 containing 35 wt % of SiO$_2$ had a high sintering temperature of 1,100° C.

Sample No. 19 using glass composition G10 containing 50 wt % of B$_2$O$_3$ and 5 wt % of SiO$_2$ had a low Q of 2,000.

Sample No. 22 using glass composition G13 containing no Li$_2$O had a slightly high sintering temperature of 1,050° C.

Sample No. 24 using glass composition G15 containing 20 wt % of Li$_2$O had an insufficient humidity resistance.

Sample No. 25 containing 40 wt % of the glass composition with respect to 55 wt % of the ceramic composition had a low relative dielectric constant of 18.

Sample No. 28 containing 8 wt % of the glass composition with respect to 90 wt % of the ceramic composition had a high sintering temperature of 1,100° C.

Sample No. 31 containing 5 wt % of CuO as a subcomponent had a low Q of 2,000.

Sample No. 34 containing 22 wt % of glass composition G1 and 15 wt % of TiO$_2$ with respect to 62 wt % of the ceramic composition had a high sintering temperature of 1,100°C.

Sample Nos. 37, 40 and 43 using glass compositions 18, 21 and 24, respectively, containing 15 wt % of RO had a low Q of 2,000 or less.

In contrast, it was understood that the dielectric ceramic compacts of the other samples had a sintering temperature of not more than 1100° C., particularly 1000° C. or less, and hence, the dielectric ceramic compacts can be obtained by firing at a low temperature. In addition, it was also understood that the dielectric ceramic compacts had a high relative dielectric constant of 24 or more, a high Q of 3,000 or more, and a temperature coefficient in the range of ±40.

When the dielectric ceramic compact of the present invention is used, since it can be obtained by firing at a low temperature, co-sintering with an inexpensive metal having a low resistance, such as Ag or Cu, can be performed, and in addition, a compact high-frequency resonator can be formed by using a manufacturing method for a laminated ceramic electronic device.

Next, embodiments relating to the structures of a multilayer ceramic substrate, a ceramic electronic device and a laminated ceramic electronic device will be described.

First Embodiment

Figure 2:
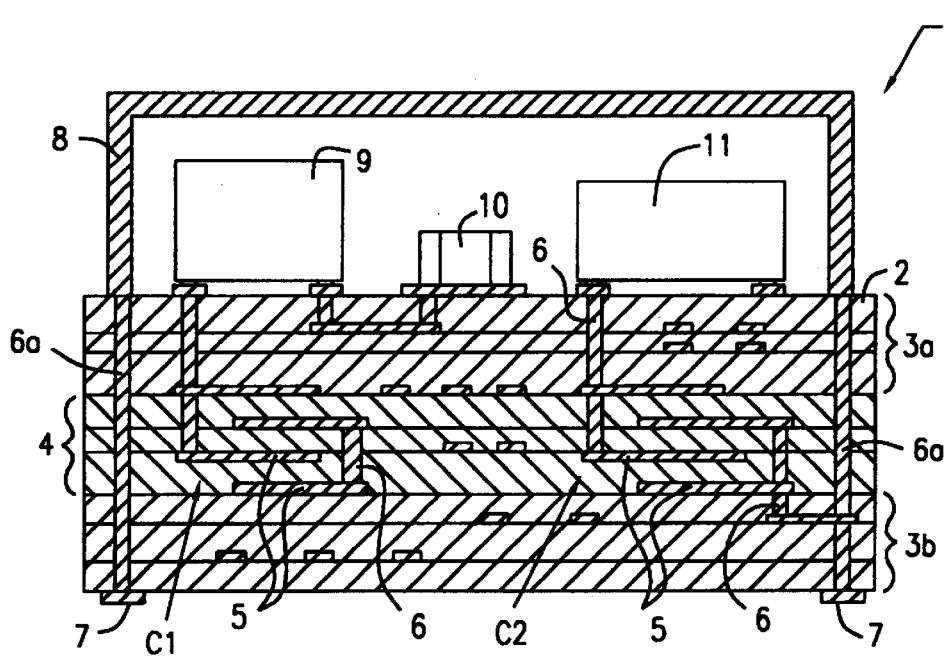
FIG. 2 is a cross-sectional view showing a multilayer ceramic module as a ceramic electronic device using a multilayer ceramic substrate of a first embodiment of the present invention.
Figure 3:
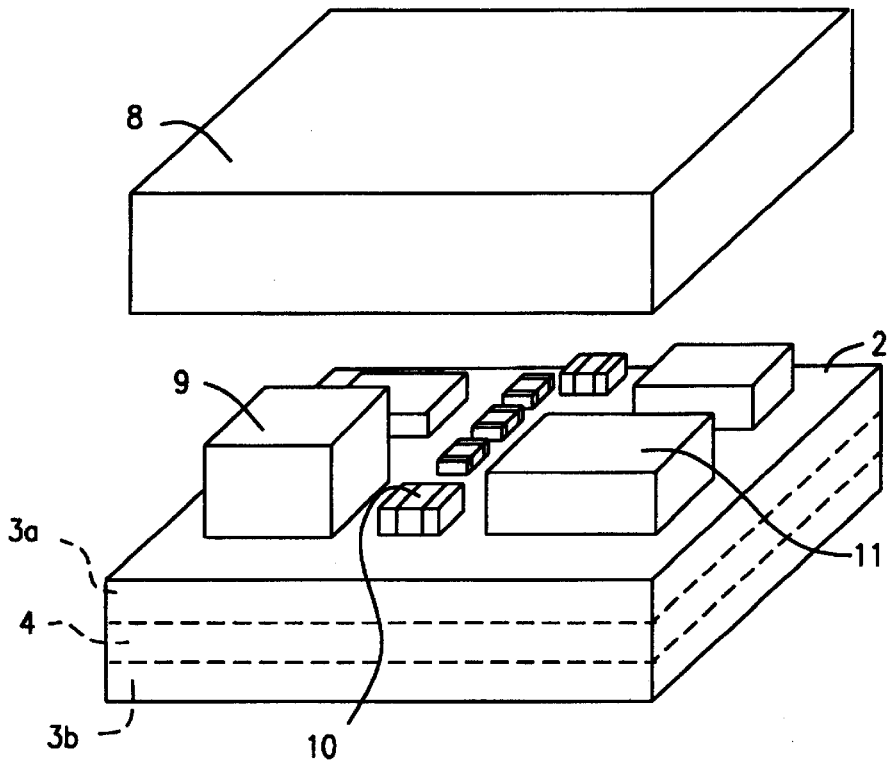
FIG. 3 is an exploded perspective view showing the multilayer ceramic module shown in FIG. 2.

FIG. 2 is a cross-sectional view showing a multilayer ceramic module as a ceramic electronic device containing a multilayer ceramic substrate of a first embodiment according to the present invention, and FIG. 3 is an exploded perspective view of the multilayer ceramic module in FIG. 2.

A multilayer ceramic module 1 is formed of a multilayer ceramic substrate 2. The multilayer ceramic substrate 2 is composed of insulating ceramic layers 3a and 3b with a dielectric ceramic layer 4 having a relatively high dielectric constant composed of the dielectric ceramic compact of the present invention provided therebetween.

A ceramic material for forming the insulating ceramic layers 3a and 3b is not specifically limited as long as the dielectric constant is lower than that of the dielectric ceramic layer 4, and for example, alumina, quartz or the like may be used.

In the dielectric ceramic layer 4, a plurality of internal electrodes 5 is disposed so as to be adjacent to each other with at least a part of the dielectric ceramic layer 4 therebetween, and hence, laminated ceramic capacitor units C1 and C2 are formed.

In the insulating ceramic layers 3a and 3b and dielectric ceramic layer 4, a plurality of via hole electrodes 6 and 6a and internal wires are formed.

In addition, on the top surface of the multilayer ceramic substrate 2, electronic elements 9 to 11 are mounted. As the electronic elements 9 to 11, optional electronic elements, such as a semiconductor element or a chip-type laminated capacitor, may be used. By the via hole electrodes 6 and the internal wires, the electronic elements 9 to 11 and the capacitor units C1 and C2 are in electrical contact with each other, whereby a circuit in the multilayer ceramic module 1 of this embodiment is formed.

Furthermore, on the top surface of the multilayer ceramic substrate 2, an electrical conductive cap 8 is fixed. The electrical conductive cap 8 is in electrical contact with the via hole electrodes 6a penetrating from the top surface to the bottom surface of the multilayer ceramic substrate 2. On the bottom surface of the multilayer ceramic substrate 2, external electrodes 7 are formed, and the external electrodes 7 are in electrical contact with the via hole electrodes 6 and 6a. Even though the other external electrodes are not shown in the figure, as are the external electrodes 7, they can be formed only on the bottom surface of the multilayer ceramic substrate 2. The other external electrodes are in electrical contact with the electronic elements 9 to 11 and the capacitor units C1 and C2 via the internal wires described above.

Since the electrodes 7 in electrical contact with the outside are formed only on the bottom surface of the multilayer ceramic substrate 2, the multilayer ceramic module 1 can be easily mounted on a printed circuit board or the like by using the bottom surface side of the multilayer ceramic module 1.

In this embodiment, since the cap 8 is formed of an electrical conductive material and is in electrical contact with the external electrodes 7 via the via hole electrodes 6a, electromagnetic shielding can be performed for the electronic elements 9 to 11 by the electrical conductive cap 8. However, the cap 8 is not necessarily formed of an electrical conductive material always.

In the multilayer ceramic module 1 of this embodiment, since the laminated capacitor units C1 and C2 composed of the dielectric ceramic compact of the present invention are formed in the multilayer ceramic substrate 2 as described above, the internal electrodes 5, electrodes for forming external wires and the via hole electrodes 6 and 6a can be formed by using an inexpensive metal having a low resistance, such as Ag or Cu, and hence, the multilayer ceramic module 1 can be obtained by co-sintering therewith. Accordingly, since the capacitor units C1 and C2 can be formed using the integrally sinterable type multilayer ceramic substrate 2, miniaturization can be performed. In addition, since the dielectric ceramic layer 4 is formed of the dielectric ceramic compact of the present invention, the relative dielectric constant is high and the Q is also high, whereby a multilayer ceramic module 1 preferably used in a high frequency band can be provided.

The multilayer ceramic substrate 2 can be easily formed by a known integral firing technique for a ceramic laminate. That is, first, ceramic green sheets primarily composed of the dielectric ceramic compact of the present invention are prepared, electrode patterns for forming the internal electrodes 5, the external wires and the via hole electrodes 6 and 6a are formed on the ceramic green sheets by printing, and the ceramic green sheets provided with the electrode patterns are laminated to each other. On ceramic green sheets for forming the insulating ceramic layers 3a and 3b on the top and the bottom surface of the laminate described above, electrode patterns are formed for forming the external wires and the via hole electrodes 6 and 6a. An optional number of the ceramic green sheets provided with the electrode patterns are laminated to each other and are then compressed in the thickness direction. By firing the laminate thus formed, the multilayer ceramic substrate 2 can be easily formed.

In each laminated capacitor units C1 and C2, since a dielectric ceramic layer having a high dielectric constant is disposed between the internal electrodes 5 adjacent to each other in the thickness direction for obtaining capacitance, a large capacitance can be obtained in a relatively small area, whereby miniaturization can also be performed.

Second Embodiment

Figure 4:
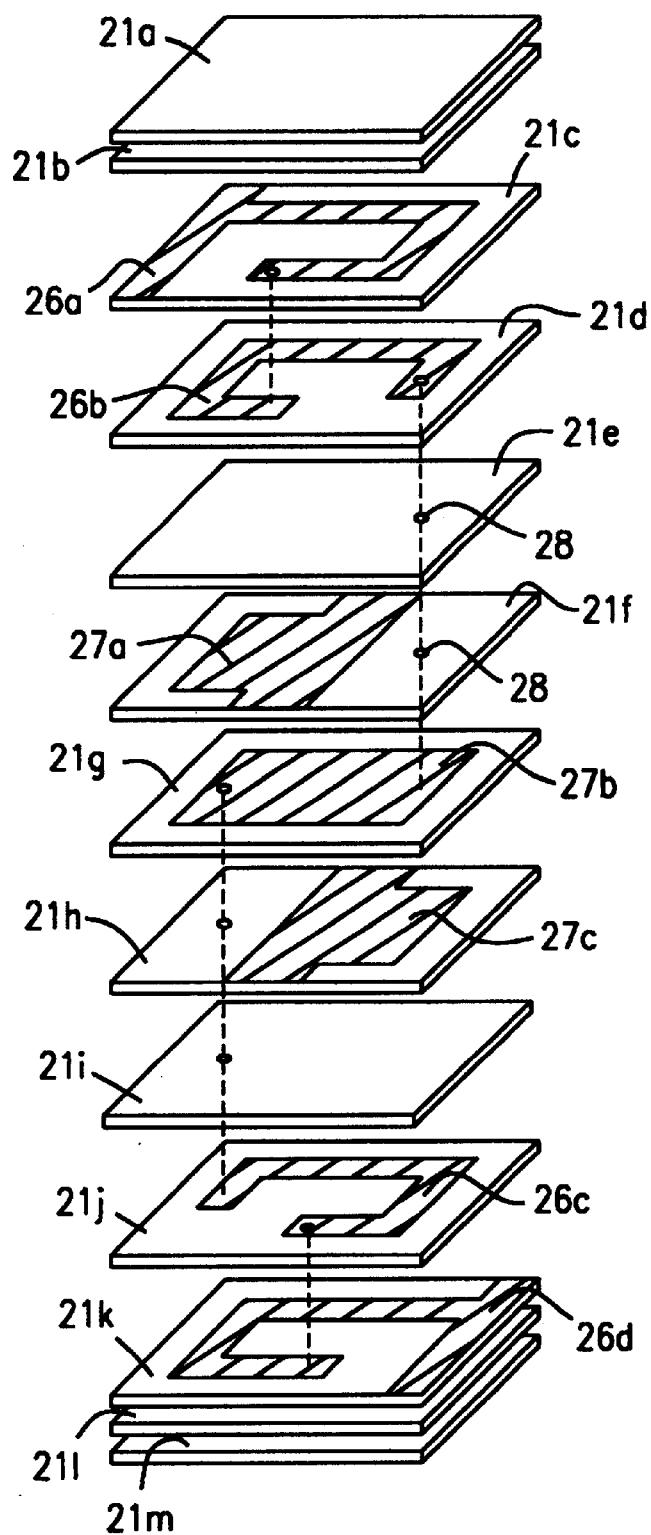
FIG. 4 is an exploded perspective view for illustrating ceramic green sheets and electrode patterns formed thereon for forming a laminated ceramic electronic device according to a second embodiment of the present invention.
Figure 5:
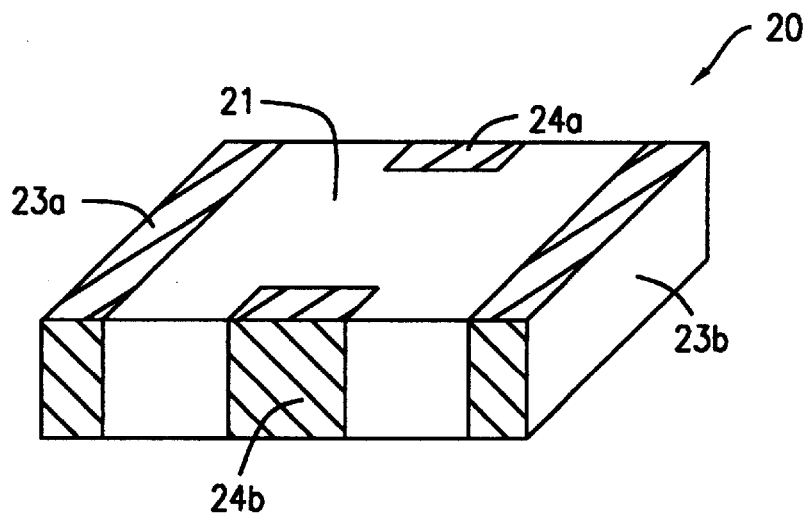
FIG. 5 is a perspective view showing the laminated ceramic electronic device according to the second embodiment of the present invention.
Figure 6:
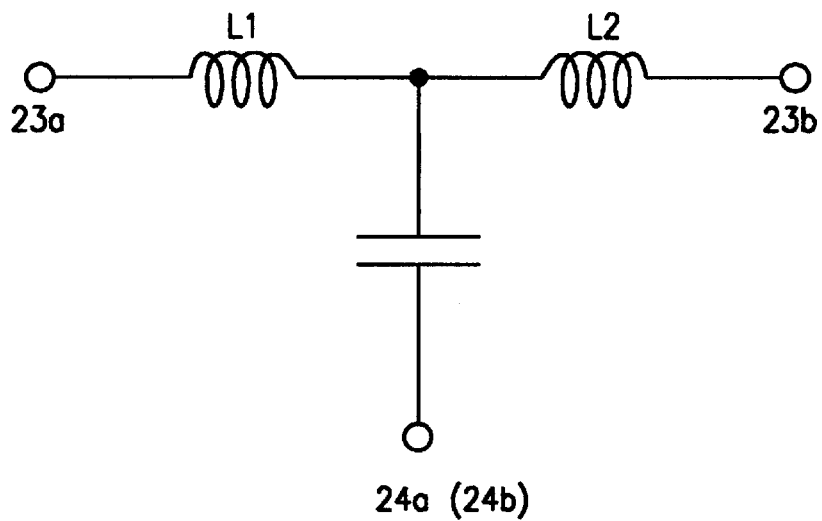
FIG. 6 is a circuit diagram of the laminated ceramic device shown in FIG. 5.

FIGS. 4 to 6 are an exploded perspective view, an external perspective view and a circuit diagram for illustrating a laminated ceramic electronic device as a second embodiment relating to the structure thereof of the present invention.

A laminated ceramic electronic device 20 shown in FIG. 5 is an LC filter. In a sintered ceramic body 21, a circuit for forming an inductance L and a capacitance C is formed as described later. The sintered ceramic body 21 is formed of the dielectric ceramic compact of the present invention. In addition, on the external surfaces of the sintered ceramic body 21, external electrodes 23a, 23b, 24a and 24b are formed, and between the external electrodes 23a, 23b, 24a and 24b, an LC resonant circuit shown in FIG. 6 is formed.

Next, a method for manufacturing the sintered ceramic body 21 will be described with reference to FIG. 4, whereby the inside structure of the sintered ceramic body 21 will be further understood.

First, an organic vehicle is added to starting materials for forming the dielectric ceramic composition of the present invention, thereby yielding a ceramic slurry. This ceramic slurry is molded, thereby forming ceramic green sheets. After the ceramic green sheets thus obtained are dried, rectangular ceramic green sheets 21a to 21m having a predetermined size are obtained therefrom by punching.

Next, in the ceramic green sheets 21a to 21m, through-holes for forming a via hole electrode 28 is formed when necessary. In addition, by performing screen printing of a conductive paste, coil conductors 26a and 26b, internal electrodes 27a to 27c for forming a capacitor, and coil conductor 26c and 26d are formed, and in addition, the via hole electrode 28 is formed by filling a conductive paste in the throughholes for forming the via hole electrode 28.

Subsequently, the ceramic green sheets 21a to 21m are laminated to each other in the directions shown in the figure and are then compressed in the thickness direction, thereby yielding the sintered ceramic body 21.

On the sintered ceramic body 21 thus formed, the external electrodes 23a to 24b are formed as shown in FIG. 5 by a thin-film forming method, such as coating/baking, deposition, plating or sputtering. As a result, the laminated ceramic electronic device 20 can be obtained.

As can be seen in FIG. 4, an inductance unit L1 is formed of the coil conductors 26a and 26b, an inductance unit L2 is formed of the coil conductors 26c and 26d, and a capacitor C is formed of the internal electrodes 27a to 27c, as shown in FIG. 6.

Since the sintered ceramic body 21 is formed of the dielectric ceramic composition of the present invention, as is the case of the multilayer ceramic substrate 2 in the first embodiment, the laminated ceramic electronic device 20 can be obtained by firing at a low temperature, and accordingly, the dielectric ceramic composition can be co-sintered with a low melting point metal, such as Cu, Ag or Au, used for the coil conductors 26a to 26c and the internal electrodes 27a to 27c for the capacitors. In addition, an LC filter preferably used in a high frequency band can be formed having a high relative dielectric constant, a high Q in a high frequency band and a small temperature coefficient tf of a resonant frequency.

In the first and the second embodiments described above relating to the structures, the multilayer ceramic module 1 and the laminated ceramic electronic device 20 forming the LC filter are described by way of example; however, the ceramic electronic device and the laminated ceramic electronic device of the present invention are not limited to the structures described above. That is, the present invention can be applied to various multilayer ceramic substrates, such as a multilayer ceramic substrate for a multichip module and a multilayer ceramic substrate for a hybrid IC; various ceramic electronic devices having the multilayer ceramic substrate described above which mount electronic elements thereon; and various chip-type laminated electronic devices such as a chip-type laminated capacitor and a chip-type laminated dielectric antenna.

Since the dielectric ceramic composition according to the present invention comprises the ceramic composition represented by the formula $xBaO—yTiO_2—ReO_{3/2}$ and the specific glass composition described above, firing can be performed at a low temperature, such as not more than 1100° C., particularly 1000° C. or less, and hence, co-sintering with a metal having a superior electrical conductivity, such as Au, Ag or Cu can be performed. Accordingly, for example, a multilayer ceramic substrate or a laminated ceramic electronic device can use the metals mentioned above as an internal electrode material, and as a result, miniaturization of the multilayer ceramic substrate or the laminated ceramic electronic device can be performed.

In addition, since the dielectric ceramic compact of the present invention has a high relative dielectric constant of 24 or more, a high Q of 3,000 or more at 1 MIZ and a small temperature coefficient of resonant frequency, the dielectric ceramic compact can be preferably used for forming a capacitor or an LC resonant circuit used in a high frequency band.

When CuO is contained as a subcomponent in addition to the primary component composed of the ceramic composition and the glass composition, since the CuO serves as an auxiliary sintering agent, low-temperature sintering properties can be improved, and in addition, the Q and the relative dielectric constant can also be increased.

Furthermore, when $TiO_2$ is contained as a subcomponent, vitrification of the glass is facilitated so that low-temperature sintering properties can be improved, and in addition, the relative dielectric constant and the Q can also be further increased.

When the primary component is formed by adding about 15 to 35 wt % of the glass composition to about 65 to 85 wt % of the ceramic composition as described above, low temperature sintering properties, a high relative dielectric constant, a high Q and a small temperature coefficient can be reliably obtained.

In particular, when about 3 wt % or less of CuO and about 1 to 10 wt % of $TiO_2$ are contained in the primary component composed of about 15 to 35 wt % of the glass composition and about 65 to 85 wt % of the ceramic composition, according to the present invention, a dielectric ceramic compact can be provided which can be obtained by sintering at not more than 1100° C., particularly 1000° C. or less, has an even higher relative dielectric constant and Q and has a small temperature coefficient.

Since the multilayer ceramic substrate of the present invention has a structure having the plurality of electrodes in the ceramic substrate composed of a dielectric ceramic layer comprising the dielectric ceramic compact of the present invention, the multilayer ceramic substrate can be obtained by firing at a low temperature, and as an electrode material, an inexpensive metal having a low resistance, such as Ag or Cu, can be used. In addition, the dielectric ceramic layer has a high relative dielectric constant, a high Q and a small temperature coefficient of resonant frequency, and hence, a multilayer ceramic substrate suitably used in a high frequency band can be provided.

When a second ceramic layer having a dielectric constant lower than that of the first ceramic layer is provided on at least one surface of the first dielectric ceramic layer, by appropriately designing the composition of the second ceramic layer and the configuration of the laminate, the strength and the environment resistance of the multilayer ceramic substrate can be optionally controlled in accordance with requirements.

When a laminated capacitor is formed by laminating the plurality of electrodes with at least a part of the first dielectric ceramic layer provided therebetween, since the dielectric ceramic compact of the present invention has a high relative dielectric constant and a high Q, the laminated capacitor can be suitably used in a high frequency band and can easily form a large capacitance. In addition, since the relative dielectric constant is high, the opposing area of the plurality of electrodes for forming the laminated capacitor can be decreased, and as a result, the dimensions of the capacitor portion can also be decreased.

When the plurality of electrodes further comprises a plurality of coil conductors for forming a laminated inductor in addition to the internal electrodes for forming the laminated capacitor, since the dielectric ceramic compact of the present invention has a high relative dielectric constant, a high Q at a high frequency and has a small temperature coefficient of resonant frequency, a compact LC resonant circuit preferably used in a high-frequency band can be easily formed.

According to the ceramic electronic device of the present invention having at least one electronic element mounted on the multilayer ceramic substrate of the present invention, various compact ceramic electronic device preferably used in a high frequency band can be provided.

In addition, when a cap is fixed on the multilayer by using the circuit configuration in the multilayer ceramic substrate and the electronic element ceramic substrate so as to surround the electronic element, the electronic element is protected by the cap, and hence, a ceramic electronic device having superior humidity resistance can be provided. When the cap is an electrical conductive cap, electromagnetic shielding can be performed for the electronic element surrounded by the cap.

When the external electrodes are formed only on the bottom surface of the multilayer ceramic substrate, the ceramic electronic device can be easily surface-mounted on a printed circuit board or the like by using the bottom surface side of the multilayer ceramic substrate.

Since the plurality of electrodes are formed in the dielectric ceramic compact of the present invention, a laminated ceramic electronic device of the invention can be obtained by firing at a low temperature, and an inexpensive metal having a low resistance, such as Ag or Cu, can be used as an internal electrode material. In addition, the dielectric ceramic compact has a high relative dielectric constant, a high Q and a small temperature coefficient of resonant frequency, so that a laminated capacitor preferably used in a high frequency band can be provided. When the plurality of electrodes comprises internal electrodes for forming a laminated capacitor, since the dielectric ceramic compact of the present invention has a high relative dielectric constant and a high Q, the laminated ceramic electronic device is suitable used in a high frequency band and can easily form a large capacitance. In addition, since the relative dielectric constant is high, the opposing area of the internal electrodes forming the laminated capacitor can be decreased, and hence, the dimensions of the capacitor portion can also be decreased.

When the plurality of electrodes comprises internal electrodes for forming a laminated capacitor and coil conductors for forming a laminated inductor, since the dielectric ceramic compact of the present invention has a high relative dielectric constant, a high Q at a high frequency and a small temperature coefficient of resonant frequency, a compact LC resonant circuit preferably used in a high frequency band can be easily formed.

What is claimed is:

1. A dielectric ceramic composition comprising:
   a ceramic composition represented by the formula $xBaO-yTiO_2-zReO_{3/2}$,
   wherein x, y, and z represent mole percent and $x+y+z=100$, $8 \leq x \leq 18$, $52.5 \leq y \leq 65$ and $20 \leq z \leq 40$, and Re indicates a rare earth element; and
   a glass composition comprising about 10 to 25 wt % of $SiO_2$, about 10 to 40 wt % of $B_2O_3$, about 25 to 55 wt % of MgO, 0 to about 20 wt % of ZnO, 0 to about 15 wt % of $Al_2O_3$, about 0.5 to 10 wt % of $Li_2O$, and 0 to about 10 wt % of RO in which R is at least one member selected from the group consisting of Ba, Sr and Ca.

2. A dielectric ceramic composition according to claim 1, further comprising CuO.

3. A dielectric ceramic composition according to claim 2, further comprising $TiO_2$.

4. A dielectric ceramic composition according to claim 3, wherein the content of the glass composition is about 15 to 35 wt % of the total amount of the glass composition and the ceramic composition.

5. A dielectric ceramic composition according to claim 4, wherein the contents of the $TiO_2$ and the CuO are about 0.1 to 10 wt % and about 3 wt % or less, respectively.

6. A dielectric ceramic composition according to claim 4, wherein Re is at least one member selected from the group consisting of Nb, Sm and Pr.

7. A dielectric ceramic composition according to claim 1, further comprising TiO2.

8. A dielectric ceramic composition according to claim 1, wherein the content of the glass composition is about 15 to 35 wt % with respect to the total amount of the glass and the $BaO-TiO_2-ReO_{3/2}$ ceramic composition.

9. A dielectric ceramic composition according to claim 1, wherein Re is at least one member selected from the group consisting of Nb, Sm and Pr.

10. A dielectric ceramic composition according to claim 9, wherein Re is Nb and Sm, and in which the glass composition does not contain RO.

11. A dielectric ceramic compact comprising a sintered dielectric ceramic composition according to claim 1.

12. A dielectric ceramic compact according claim 11, wherein the dielectric ceramic composition was sintered at a temperature of not more than 1100° C.

13. A dielectric ceramic compact according to claim 11, having a crystal phase precipitated in the ceramic compact, wherein the crystal phase is at least one member selected form the group consisting of $Mg_2B_2O_5$, $Mg_3B_2O_6$, $BaTi_4O_9$, $Ba_2Ti_9O_{20}$, $Mg_2TiO_4$, $Mg_2SiO_4$, $Zn_2TiO_4$, $Zn_2Ti_3O_8$ and $ZnAl_2O_4$.

14. A multilayer ceramic substrate comprising, in combination,
   a first dielectric ceramic layer comprising a dielectric ceramic compact according to claim 11; and
   a plurality of electrodes.

15. A multilayer ceramic substrate according to claim 14, further comprising a second dielectric ceramic layer provided on at least one surface of the first dielectric ceramic layer;
   wherein the second dielectric ceramic layer has a dielectric constant lower than that of the first dielectric ceramic layer.

16. A multilayer ceramic substrate according to claim 15, wherein two of said plurality of electrodes are disposed so as to oppose each other with at least a part of the first dielectric ceramic layer provided therebetween so as to form a capacitor.

17. A ceramic electronic device comprising:
   a multilayer ceramic substrate according to claim 14, and
   at least one electronic element mounted on the multilayer ceramic substrate and forming a circuit together with at least some of said electrodes.

18. A laminated ceramic electronic device comprising:
   a sintered ceramic body comprising a dielectric ceramic compact according to claim 11 having an exterior surface;
   a plurality of internal electrodes disposed in the sintered ceramic body; and
   a plurality of external electrodes on the exterior surface of the sintered ceramic body each of which is in electrical contact with at least one of the plurality of internal electrodes.

19. A laminated ceramic electronic device according to claim 18, wherein two of the plurality of internal electrodes oppose each other with at least a part of the sintered ceramic body therebetween so as to form a capacitor unit.

20. A laminated ceramic electronic device according to claim 19, wherein internal electrodes other than said two of the plurality of electrodes further comprises a coil conductor so as to form a laminated inductor unit.

* * * * *